United States Patent [19]

Schubert et al.

[11] Patent Number: 5,170,407
[45] Date of Patent: Dec. 8, 1992

[54] ELIMINATION OF HETEROJUNCTION BAND DISCONTINUITIES

[75] Inventors: Erdmann F. Schubert, New Providence; Li-Wei Tu, Westfield; George J. Zydzik, Columbia, all of N.J.

[73] Assignee: AT&T Bell Laboratories, Murray Hill, N.J.

[21] Appl. No.: 777,836

[22] Filed: Oct. 11, 1991

[51] Int. Cl.$^5$ .................................................. H01S 3/08
[52] U.S. Cl. ......................................... 372/96; 372/45
[58] Field of Search ................. 372/96, 45, 99; 357/17

[56] References Cited

U.S. PATENT DOCUMENTS

| | | | |
|---|---|---|---|
| 4,794,440 | 12/1988 | Capasso et al. | 357/34 |
| 4,949,350 | 8/1990 | Jewell et al. | 372/45 |
| 5,034,958 | 7/1991 | Kwon et al. | 372/96 |

FOREIGN PATENT DOCUMENTS 0199085  9/1987  Japan ..................... 372/96

OTHER PUBLICATIONS

K. Tai et al., "Drastic Reduction of Series Resistance in Doped Semiconductor Distributed Bragg Reflectors for Surface-Emitting Lasers", *Appl. Phys. Lett.*, 56 (25), Jun. 18, 1990, pp. 2496–2498.

R. S. Geels et al., "Low Threshold Planarized Vertical-Cavity Surface-Emitting Lasers", *IEEE Photonics Technology Letters*, vol. 2, No. 4, Apr. 1990, pp. 234–236.

Federico Capasso et al., "Doping Interface Dipoles: Tunable Heterojunction Barrier Heights and Band-Edge Discontinuites by Molecular Beam Epiaxy", *Appl. Phys. Lett.*, 46 (7), Apr. 1, 1985, pp. 664–666.

H. Kogelnik et al., "Coupled-Wave Theory of Distributed Feedback Lasers", *Journal of Applied Physics*, vol. 43, No. 5, May 1972, pp. 2327–2335.

M. Sundaram et al., "Modulation-Doped Graded Structures: Growth and Characterization", *Journal of Applied Physics*, vol. 69, No. 4, Feb. 15, 1991, pp. 2370–2375.

*Primary Examiner*—Georgia Y. Epps
*Attorney, Agent, or Firm*—Oleg E. Alber

[57] ABSTRACT

Conduction band or valence band discontinuities occurring at the junction of two unipolar heterogeneous semiconductors can be eliminated by compositional grading of the heterointerface and appropriate doping of the interfacial region. The compositional potential of graded junction and an interface dipole potential generated by modulation doping of the interfacial region are selected such that they exactly compensate each other. The compositional grading of the interface is achieved by semiparabolic grading of narrow regions immediately adjacent each side of the interface. The modulation doping is achieved by doping the two materials with suitable dopants, donors for the conductance band or acceptors for the valence band, depending on the polarity of the structure. This reduces the resistance in periodic semiconductor multilayer structures leading to low-resistance distributed Bragg reflectors.

12 Claims, 6 Drawing Sheets

FIG.4 BUILT-IN POTENTIAL

FIG.5 ACCEPTORS

FIG.6 HOLES

ELIMINATION OF HETEROJUNCTION BAND DISCONTINUITIES

TECHNICAL FIELD

This invention concerns heterojunction band discontinuities in semiconductor distributed Bragg reflectors usable in surface emitting lasers.

BACKGROUND OF THE INVENTION

Optical distributed Bragg reflector (DBR) is a unipolar heterostructure which consists of many alternating layers of two semiconductors of the same conductivity type, e.g., n-type, p-type, or intrinsic, with different refractive index, each layer having a respective thickness of a quarter wavelength and refractive index different from the refractive index of adjacent layers. When the DBR is used for current conduction, as is the case in surface emitting lasers (SELs) or surface emitting diodes, constituent heterojunction band discontinuities impede the current flow, which is a highly undesired concomitant effect.

Surface emitting lasers (SELs) are attractive as being of a small area, being capable of low divergence output beams, being inherently single longitudinal mode, being capable of having threshold current comparable to edge emitting lasers and being producible by planar technology. DBRs consisting of stacks of periodic quarter wavelength layers forming pairs of layers (or periods) each consisting of a low and a high refractive index compound semiconductors are used in the SELs. While the index difference between adjacent layers provides high optical reflectivity, energy bandgap difference leads to interface discontinuities forming potential barriers in the heterointerfaces between the two adjacent constituent layers of the DBR structures. Since current transport in many surface emitting laser structures occurs across heterojunction barriers, these potential barriers impede the carrier flow in the DBR structures and result in series resistance which gives rise to thermal heating of the device and thus deteriorates the laser performance. Attempts were made to reduce the series resistance, which included linear grading, step grading, and superlattice grading the DBR structures. For example, see K. Tai et al., "Drastic reduction of series resistance in doped semiconductor distributed Bragg reflectors for surface-emitting lasers," *Appl. Phys. Lett.* 56 (25), Jun. 18, 1990, pages 2496-2498; R. S. Geels et al., "Low Threshold Planarized Vertical-Cavity Surface Emitting Lasers," *IEEE Photonics Technology Letters*, Vol. 2, No. 4, April 1990, pages 234-236; Federico Capasso et al., "Doping interface dipoles: Tunable heterojunction barrier heights and band-edge discontinuities by molecular beam epitaxy," *Appl. Phys. Lett.* 46 (7), Apr. 1, 1985, pages 664-666 and U.S. Pat. No. 4,794,440 issued on Dec. 27, 1988 to F. Capasso. However, none of these attempts lead to the elimination of heterojunction band discontinuities between two different materials of the same conductivity type in the DBR. Therefore, a process for optimization, that is elimination of the heterojunction band discontinuities in the DBR, is still desirable.

SUMMARY OF THE INVENTION

Conduction band or valence band discontinuities occurring at the junction of two unipolar heterogeneous semiconductors are eliminated by composition grading of the heterointerface and appropriate doping of the interfacial region. The compositional potential of a graded junction and an interface dipole potential generated by modulation doping of the interfacial region are selected such that they exactly compensate each other. The composition grading of the interface is achieved by semiparabolic grading of narrow regions immediately adjacent each side of the interface. The modulation doping is achieved by doping the two materials with suitable dopants, donors for the conduction band or acceptors for the valence band, depending on the polarity of the structure. This reduces the resistance in periodic semiconductor multilayer structures leading to low-resistance distributed Bragg reflectors.

DETAILED DESCRIPTION

Figure 1:
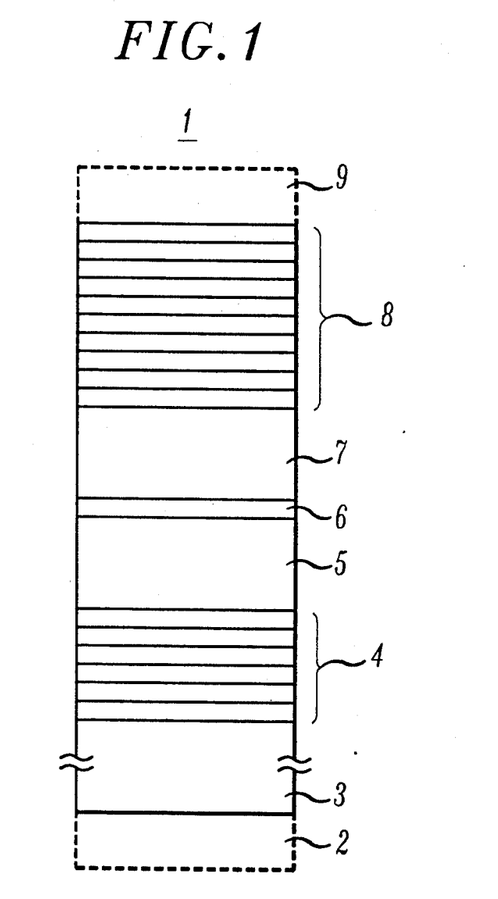
FIG. 1 is a schematic representation of a typical surface emitting laser with two multilayer distributed Bragg reflector (DBR) mirrors.

In FIG. 1 is shown schematically a representative surface-emitting laser (SEL), generally denoted as 1. For reasons of clarity, the elements of the SEL are not drawn to scale. For the same reasons, relative dimensions used in other Figures may be out of scale, also. The SEL includes, in ascending sequence, a bottom electrode, 2, a substrate, 3, a bottom mirror, 4, a buffer or confinement region, 5, an active region, 6, a buffer or confinement region, 7, a top mirror, 8, and a top electrode, 9. A conductive layer (not shown) may optionally be positioned between an upper layer of the top mirror and the top electrode. Each of the electrodes, which are shown in phantom, may have a different configuration as is known in the art, depending on the direction of lasing emission from the laser. Except for electrodes, the SEL materials are selected from semiconductors based on Group III–Group V and Group II–Group VI compound semiconductors, which are often referred to as III–V and II–VI compound semiconductors. These compound semiconductors include GaAs, InP, AlAs, GaInAs, GaInAsP, GaAlAs, and InAlAs.

Depending on the design, either one or both of the bottom and top mirrors of the SEL may be a quarter-wave ($\lambda/4n$) semiconductor multilayer distributed Bragg reflector (DBR) where $\lambda$ is the vacuum wavelength of laser emission and n is the refractive index of the material. Such mirrors are built-up of a plurality of semiconductor layers one quarter-wavelength thick, respectively, arranged in an alternating sequence into a stack of a plurality of pairs (or periods) of semiconductor layers, one layer in each pair having a refractive index different from the refractive index of the other layer in the same pair. Each of the top or bottom or both DBR mirrors is of only one respective type conductivity, that is each mirror is of a unipolar construction. For example, if the SEL shown in FIG. 1 is GaAs-based with substrate 2 of an n-type doped GaAs, then bottom mirror 3 is an n-type DBR mirror and top mirror 6 is a p-type DBR mirror. In an InP-based SEL, the opposite structure may exist.

Each of these mirrors is built up as a stack of alternating layers with dissimilar composition and with dissimilar index of refraction, forming from 2 to 30 or more pairs of layers. For example, if one layer in a pair is GaAs, the other layer may be $Al_xGa_{1-x}As$ with x being within a range from $>0$ to 1. Layers in a stack are of the same type of conductivity, so that the DBR has a unipolar structure. Each of these layers is heterogeneous relative to another, adjacent layer, forming a heterojunction between the adjacent layers. Each of these layers has a different energy bandgap than their adjacent layers.

Figure 2:
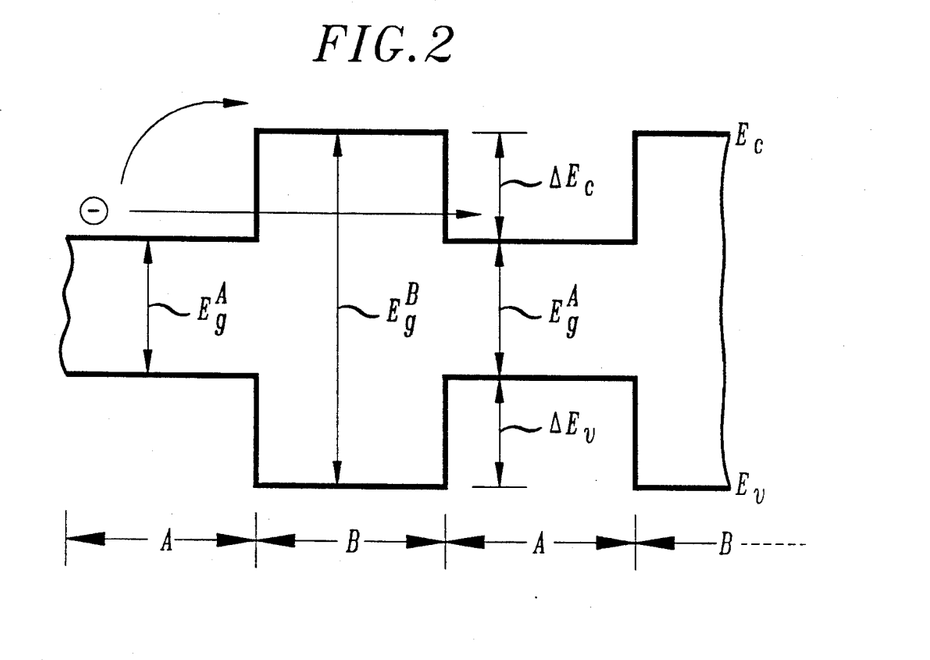
FIG. 2 is a schematic representation of an energy band diagram for incomplete 2 pairs of layers (or periods) of a typical DBR.

A representative energy bandgap diagram for an incomplete 2 pairs (or periods) of the DBR mirror is shown in FIG. 2 of the drawings. It is seen that the edge of conduction band energy ($E_c^A$), the edge of valency band energy ($E_v^A$) and the energy band gap ($E_g^A$) of material A (e.g. GaAs) is much smaller than the edge of conduction band energy ($E_v^B$), the edge of valency band energy ($E_v^B$) and the band gap ($E_g^B$) of material B (e.g. AlAs, x=1) respectively. The energy bandgap difference, ($\Delta E_g$) which scales roughly linearly with refractive index difference, results in potential barriers in the heterointerfaces. The size of respective energy bands and the energy band differences for a heterojunction pair such as GaAs/AlAs are shown schematically in FIG. 3. The charge carrier transport across a heterojunction is illustrated in FIG. 2 which shows the band diagram of two semiconductors "A" and "B", e.g., GaAs and AlAs. Band discontinuities occur in the conduction and valence band since the fundamental gap of semiconductor "B" is larger than the gap of "A". Transport across the heterojunction barrier can occur via thermal emission (curved arrow) or via tunneling (straight arrow) as is schematically shown in FIG. 2. For sufficiently thick and high barriers, tunneling and thermal emission of carriers are not efficient transport mechanisms across the barrier. This leads to series resistance and thermal heating and results in the deterioration of the laser performance. These results are especially notable in the p-type doping cases. It is, therefore, desirable to eliminate such heterojunction band discontinuities in the conduction or valence band.

The present inventors have discovered that the heterojunction discontinuities may be overcome by a controlled grading of the semiconductor composition at a region of the heterointerface with simultaneous modulation doping of the structure. In accordance with this invention, a region of the two materials adjacent the heterointerface is composition graded in such a way that each of the band-edges changes parabolically in the growth direction. If there are two semiconductors "A" and "B", the interface between the two semiconductors can be graded, i.e., have a composition $A_yB_{1-y}$ such that the edge of band energy varies parabolically from composition A to composition B. Since only the fundamental Fourier component of the spatially varying refractive index determines the optical reflectivity, (see H. Kogelnik, "Coupled-Wave Theory of Distributed Feedback Lasers", *Journal of Applied Physics*, Vol. 43, No. 5, May 1972, pp. 2327-2335) the type and shape of the grading do not alter the optical properties of the DBR significantly. However, since the bandgap varies linearly with the composition, a parabolic grading of the composition corresponds to a parabolic variation of the bandgap energy. Heterojunction band discontinuities are further eliminated by a dopant carrier dipole which exactly compensates the compositional potential of the heterojunction. The interfacial region is doped in such a way that the electrostatic dopant/free carrier potential exactly compensates for the compositional "built-in" potential of the heterojunction.

The composition grading of the interface region is conducted by parabolic grading. The grading extends from a layer with composition A to a layer with composition B through a small thickness region on each side of the heterojunction. Each region adjacent the heterointerface is graded in a semiparabolic fashion, such that material A is semiparabolically graded from within a certain thickness of material A to the interface, and material B is semiparabolically graded in an inverted fashion from the interface to within a certain thickness of material B.

In an exemplary embodiment, the top mirror is a stack of alternating layers of GaAs and AlAs having a p-type conductivity. GaAs, with refractive index of 3.5 and Eg of 1.42 eV, is deposited in layers from 600 to 700 Angstrom thick and AlAs, with refractive index of 2.9 and Eg of 2.9 eV, is deposited in layers from 700 to 800 Angstrom thick. A region from 50 to 500 Angstrom thick on each side of the heterojunction shall be semiparabolically graded compositionally beginning with GaAs and ending with AlAs, with the graded region having the composition $Ga_{1-x}Al_x$ As with x ranging from 0 through 1. The composition begins with $Ga_{1-x}Al_x$ As on the GaAs side with x=0 and is semiparabolically graded to an interface with x=0.5 and from then on in an inverted semiparabola to a composition wherein x=1 (AlAs). In some cases, the two semiconductors may originally have more than two components so that either composition may include a small fraction of the other component. For example, the GaAs layer may include Al with x being from 0 to 0.30, ($Al_{0-0.30}Ga_{1.0-0.70}As$) and the AlAs layer may contain a small proportion, such as from 0 to 0.30, of Ga, with x ranging from 1 to 0.70, (e.g. $Ga_{0-0.30}Al_{1.0-0.70}As$). In this case, if one material (A) is $Al_{0.10}Ga_{0.90}As$ and the other (B) is $Al_{0.95}Ga_{0.05}As$, the grading would occur between $x=0.10$ and $x=0.95$.

Figure 3:
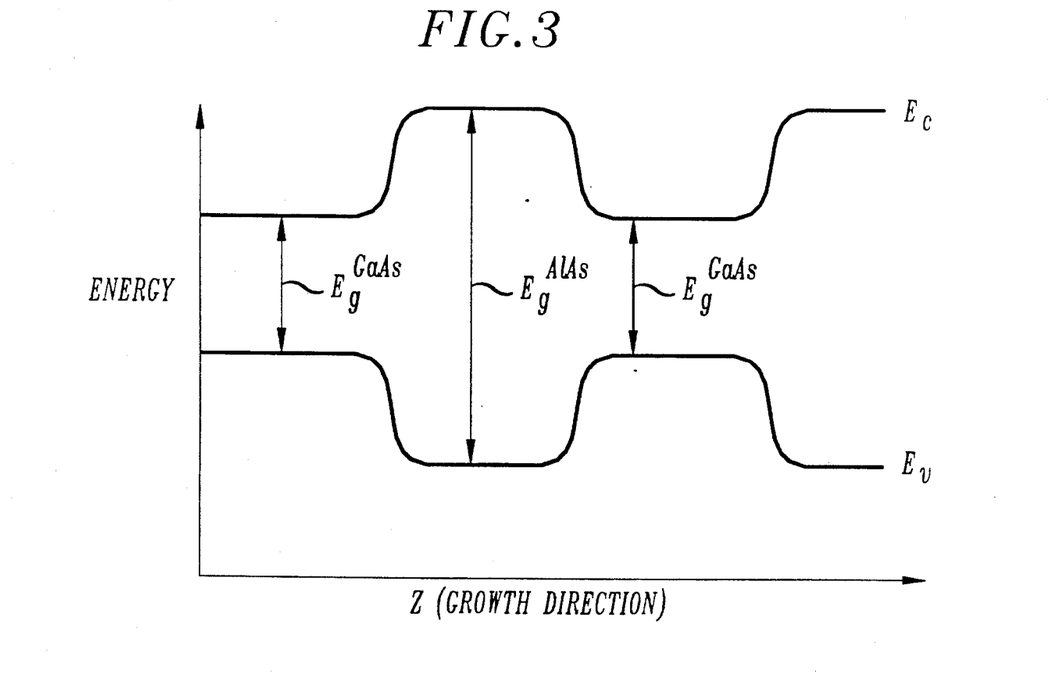
FIG. 3 is a schematic representation of the energy band diagram of FIG. 2 which was parabolically composition graded.

In the fabrication of the DBR stack the layers are conveniently deposited by molecular beam epitaxy (MBE), a well-known technique. Typically, the GaAs and AlAs layers are deposited by alternative positioning of a shutter in front of a furnace containing desired material. A technique used by A. C. Gossard et al. was used in producing the specific semiparabollic grading of the heterointerface region. See A. C. Gossard et al. "MBE Growth and Energy Levels of Quantum Wells With Special Shapes", Surface Science 174 (1986) pages 131-135, North Holland-Amsterdam. Gossard used computer controlled pulsed MBE to produce half-parabolic composition grading of a single well in a multilayer well. In this instance, the pulsed MBE may be used to produce semi-parabolic and inverted semiparabollic composition grading of each narrow region adjacent to the heterointerface between two materials A (e.g. GaAs) and B (e.g. AlAs) with a point of inversion being at a midpoint of the heterointerface. To do the parabolic composition grading of the heterointerface region, a shutter for Al is opened at prorated intervals of time while GaAs is deposited, e.g., so as to go semiparabolically from $x=0$ to $x=0.5$ (at the heterojunction) composition. At this time deposition of AlAs begins with an inverted semiparabolic grading during which a shutter for Ga is closed at prorated intervals while AlAs is deposited, so that Al content goes from 0.5 to 1, while Ga content goes from 0.5 (for $x=0.5$) to zero (for $x=1$). The result is a region with a parabolically graded composition, as is schematically shown in FIG. 3. Alternatively, the parabolic grading may be achieved during MBE growth with a constant deposition rate by adjusting the Al and Ga effusion cell temperatures.

The parabolic composition grading results in the band diagram shown in FIG. 3. While this configuration smoothes out the sharp band discontinuities between the two original materials of the heterojunction, it still presents an obstacle to the free movement of electrons and holes. This may be further ameliorated by adjusting either one of the band edges with suitable dopants. Donor dopants selected from Si, Sn, and Te and acceptor dopants selected from Be, C, Mg, and Zn may be used as the suitable dopants. Other dopants may be used as is well known in the art. In case of a p-type conductivity in the materials of the DBR, this may be accomplished by means of modulation of doping concentration of the composition graded regions of both materials with suitable acceptor dopants, with one of the two graded regions of the heterionterface being acceptor doped and the other being left undoped.

Figure 7:
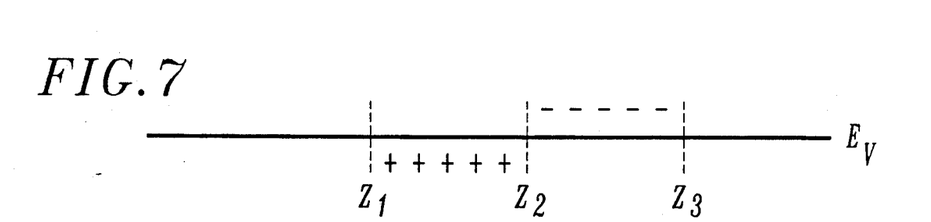
FIG. 7 is a schematic representation of a flat valence band edge due to the compensation of the compositional built-in-potential and the doping dipole potential as is shown in FIGS. 5, 6 and 7.
Figure 11:
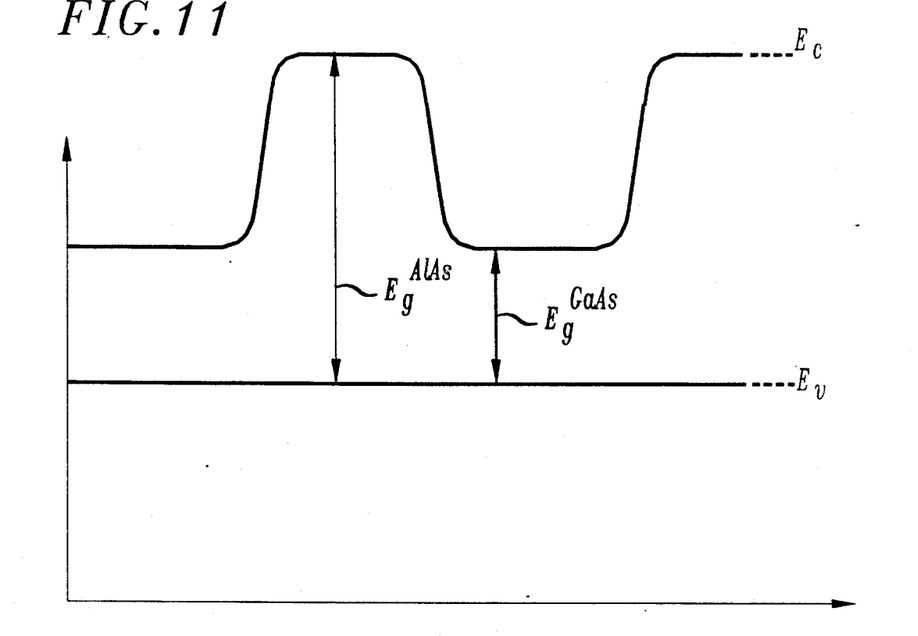
FIG. 11 is a schematic representation of a band diagram of a p-type modulation doped, parabolically composition graded structure of FIGS. 2 and 3, with the entire band discontinuity being confined to the conduction band.

In FIGS. 4-7 is schematically shown modulation doping of a portion of the valence band of one heterojunction with acceptor dopants. Free carriers diffuse into the undoped region and leave the adjacent region depleted of free carriers. The separation of free carriers from their parent impurities creates an electric dipole which leads to a flattening of the valence band, as is shown in FIG. 7. As a consequence of the composition and dipole grading, the $E_c$ curve is smoothed out and the $E_v$ curve becomes flat, as is shown in FIG. 11. A similar, but inverted effect could be achieved with modulation doping the conduction band with donor dopants.

Figure 4:
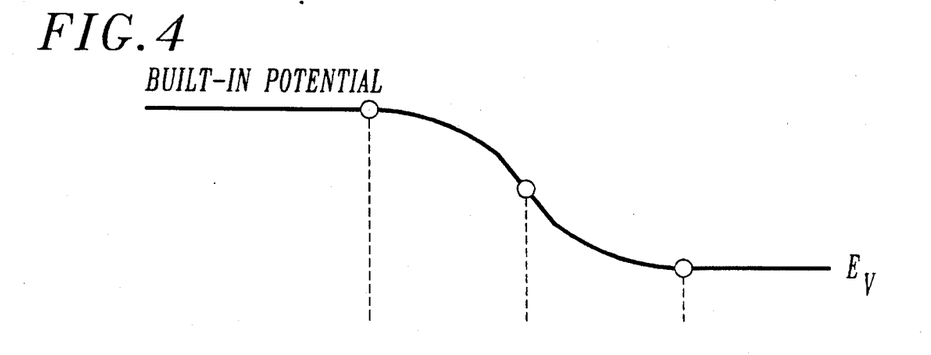
FIG. 4 is a schematic enlarged representation of a built-in potential of the composition graded interface of one heterojunction.
Figure 5:
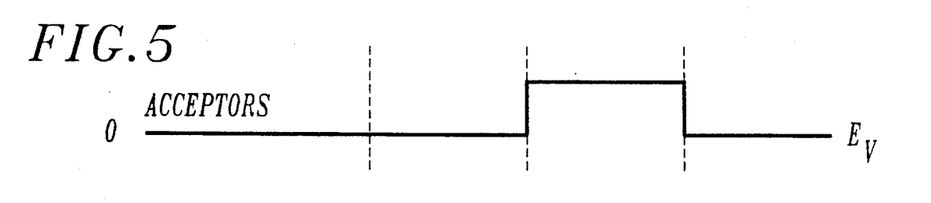
FIG. 5 is a schematic representation of an acceptor profile of one region of the composition graded heterointerface shown in FIG. 4.
Figure 6:
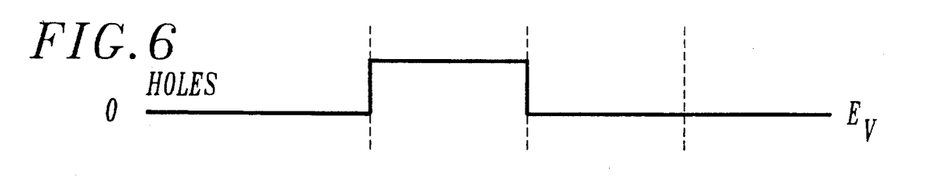
FIG. 6 is a schematic representation of a hole distribution resulting from the acceptor doping as is shown in FIG. 5.

Modulation doping of a parabolically graded heterojunction results in a flat band edge potential. An enlarged representation of the band diagram of a parabolically compositionally graded valence band edge is shown in FIG. 4 for a single heterojunction. The energy of the valence band edge increases parabolically with a negative second derivative between the points $z_1$ and $z_2$. The band edge further increases parabolically with a positive second derivative between $z_2$ and $z_3$. The energy of the valence band edge can be expressed as $$E_v = \begin{cases} E_v(z_1) - \alpha(z - z_1)^2 & \text{for } z_1 \leq z \leq z_2 \quad (1a) \\ E_v(z_1) - \Delta E_v + \alpha(z - z_3)^2 & \text{for } z_2 \leq z \leq z_3 \quad (1b) \end{cases}$$

where $\alpha(z_2-z_1)^2 = \alpha(z_3-z_2)^2 = \frac{1}{2}\Delta E_v$ and z is a spatial coordinate along the optical axis of the structure. If the region $z_2 \leq z \leq z_3$ is doped with acceptors of concentration $N_A$, holes will transfer to the low-energy side of the junction i.e. to the region $z_1 \leq z \leq z_2$. In order to obtain a flat valence band, the doping concentration, $N_A$, is selected in such a way that the depletion potential equals half of the heterojunction discontinuity, i.e.

$$\frac{1}{2}\Delta E_v = \frac{e^2}{2\epsilon} N_A (z_3 - z_2)^2,$$

where e is an electronic charge, $\epsilon$ is the permittivity of a semiconductor, and $N_A$ is an intentional acceptor concentration in the doped region. For a given thickness of the graded region ($z_3-z_2$) and a given material system ($\Delta E_v$), the equation allows one to determine the doping concentration which results in a flat band edge. That is, the depletion potential of the depleted acceptor layer exactly compensates for the built-in compositional potential of the heterojunction.

Parabolic modulation-doped quantum wells result in a spatially constant electron concentration in the parabolically composition-graded well. The constant electron concentration has been demonstrated previously experimentally as well as theoretically by self-consistent quantum mechanical calculations. For example, see M. Sundaram et al., "Modulation-doped Graded Structures: Growth and Characterization", *Journal of Applied Physics*, Vol. 69, No. 4, Feb. 15, 1991, pp. 2370-2375. The electron concentration adjusts itself in such a way that a flat band edge results. Thus, the acceptor and hole distribution shown in FIGS. 5 and 6 compensate the built-in potential and result in a flat valence band edge as is shown in FIG. 7. Note that the majority carrier concentration decreases exponentially with the screening length at $z_1$ and $z_2$ which leads to a residual modulation. Furthermore, the Fermi level is constant across the entire structure which implies a slightly modulated conduction band edge considering the spatially varying electron concentration. Self-consistent band diagram calculations yield that the residual modulation is indeed very small.

Distributed Bragg reflectors consisting of 20 quarter-wave pairs of p-type $AlAs/Al_{0.14}Ga_{0.86}As$ were grown on $n^+$-type (001)-oriented GaAs substrates by MBE. The heterointerfacial regions of several samples were abrupt, step-graded, and parabolically graded. The parabolically composition graded regions were also modulation doped. The graded regions have total thickness of 350 Å and a doping concentration of $1-5\times10^{18}$ cm$^{-3}$. Optical reflectivity spectra of the reflectors yield excellent reflectivity ($>99\%$) centered at 850 nm. The parabolic composition grading was achieved during molecular beam epitaxial growth with a constant deposition rate of 0.3 μm/hr by adjusting the Al- and Ga-effusion cell temperatures.

Figure 8:
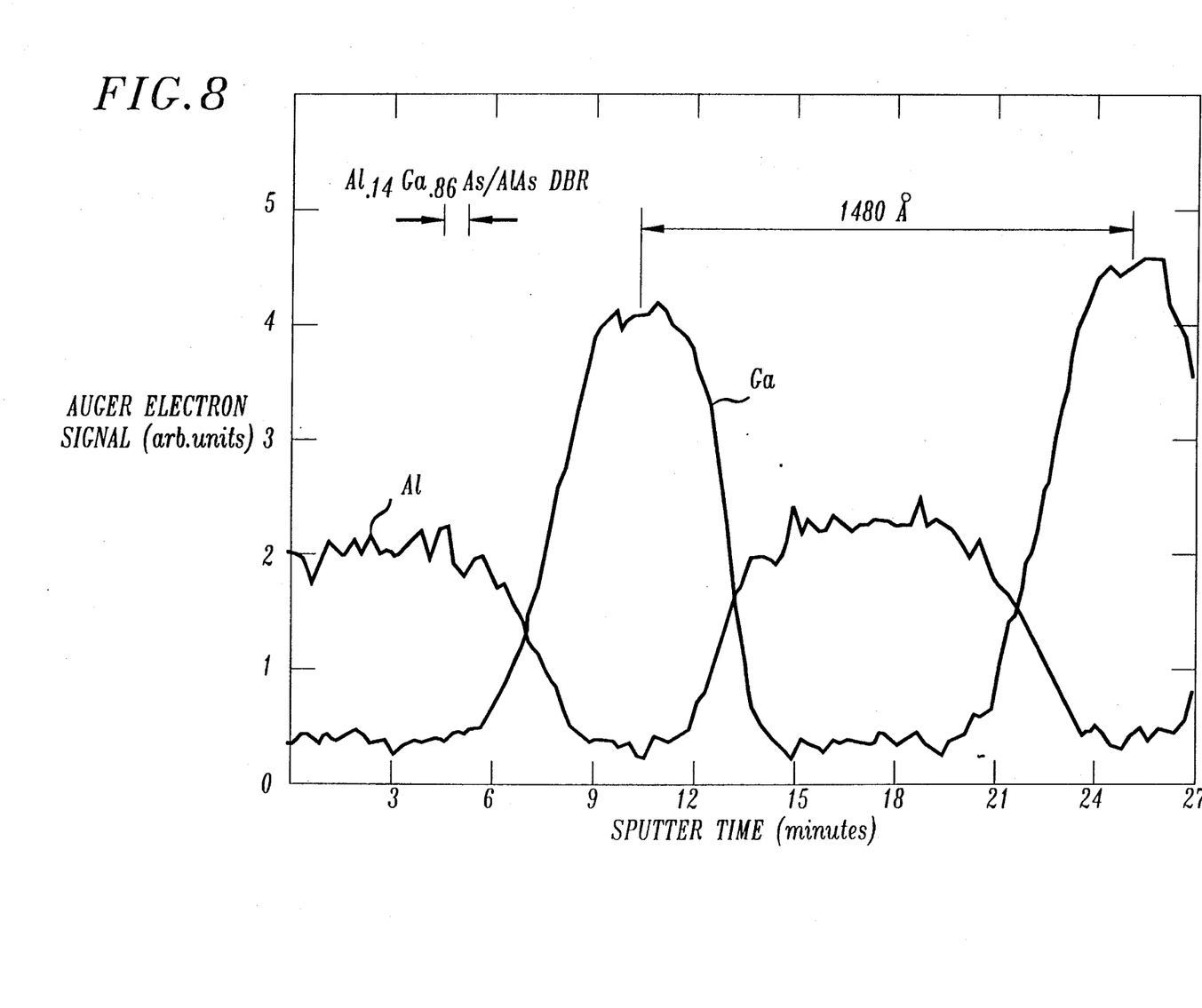
FIG. 8 is a schematic representation of an Auger electron spectroscopy (AES) profile of a GaAs/AlAs multilayer with parabolically composition graded interfacial region.

The parabolic grading is evidenced by Auger electron spectroscopy with the Auger profile of a parabolically graded AlAs/AlGaAs reflector shown in FIG. 8. The Al and Ga Auger electron signals exhibit parabolic transitions. No discontinuity or kink is evidenced for the Al and Ga signal in the transition region indicating the suitability of continuous composition grading as an alternative to the shutter controlled composition grading, to grow well-controlled profiles.

Figure 9:
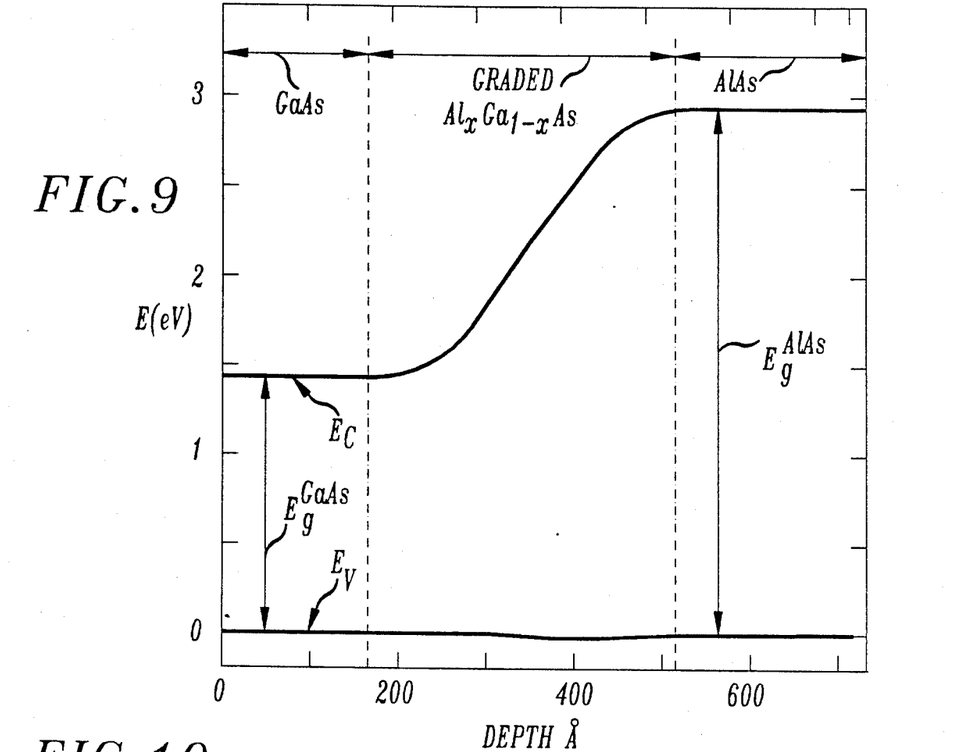
FIG. 9 is a schematic representation of a calculated band diagram of a p-type modulation-doped, parabolically composition graded GaAs/AlAs heterojunction with entire band discontinuity being confined to the conduction band.
Figure 10:
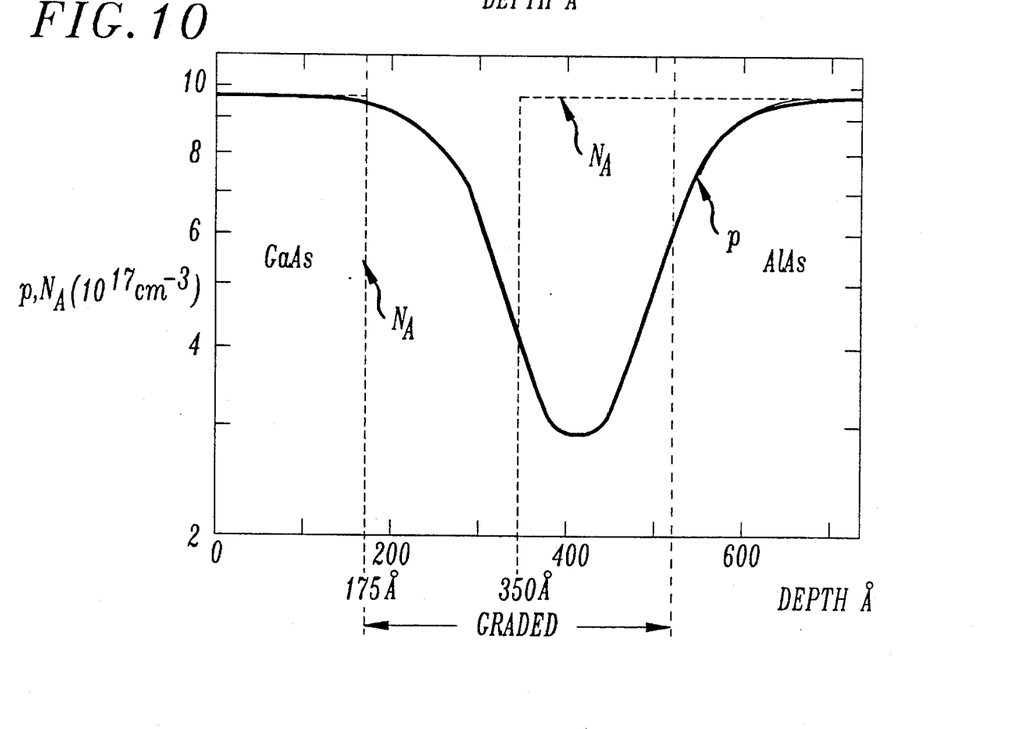
FIG. 10 is a schematic representation of a hole and acceptor distribution of the heterojunction structure of FIG. 9.

The calcualted band diagram and the free carrier concentration of a p-type GaAs/AlaAs heterojunction treated in accordance with this invention are shown in FIGS. 9 and 10, respectively. The self consistent calculation demonstrates that the valence band discontinuity is effectively eliminated. The free hole and acceptor distribution demonstrate that the graded doped region is depleted of free holes and that free carriers have transferred to the undoped part of the graded interfacial regions. A residual modulation of the valence band edge of 28 meV is due to the spatial variation of the hole concentration in the depletion region. However, the residual modulation can be further reduced by increasing the doping concentration in the depleted region.

Figure 12:
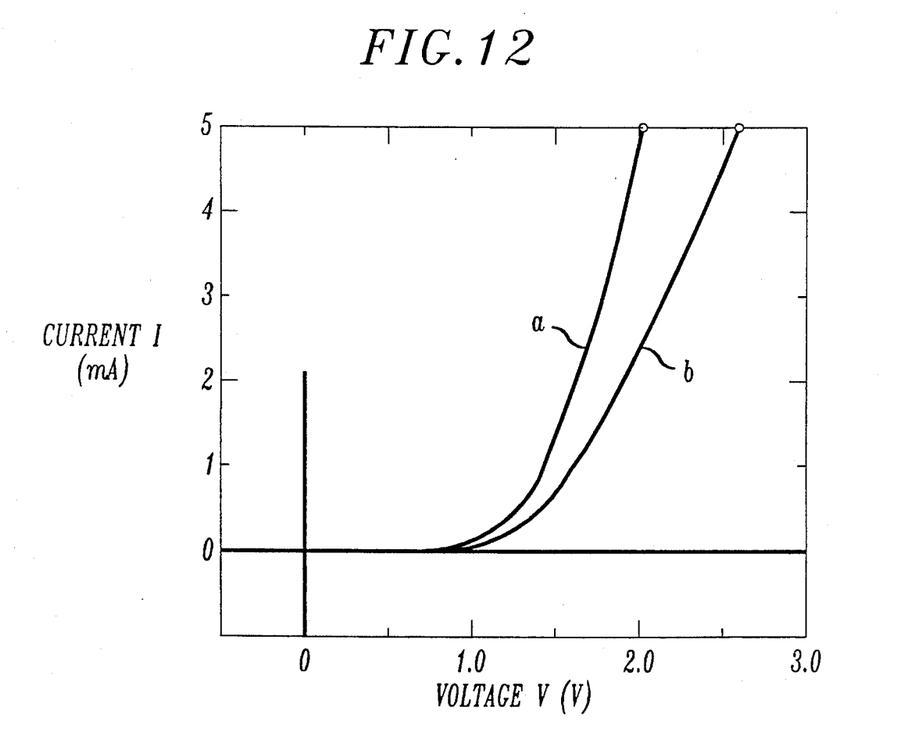
FIG. 12 is a plot of current-voltage characteristics of a pn-junction diode with a 20 period p-type GaAs/AlAs DBR for samples which employ modulation doping and parabolic composition grading (curve a) and conventional single step composition grading (curve b).

Current-voltage characteristics of a parabolically graded structure modulation doped with Be and a step-graded structure are shown in FIG. 12. The series resistance of the structure was evaluated at current of 5 mA. Resistances of 98Ω (curve a) and 185Ω (curve b) are evaluated for the modulation doped parabolically graded and the step graded structure, respectively. The experimental results clearly demonstrate that the resistance of the modulation doped parabolically graded structure is significantly improved. Further improvement may be expected for doping impurities other than Be, which is a fast diffuser in AlAs, or for some other III–V compounds.

We claim:

1. An optical device including at least one multilayer distributed Bragg reflector mirror consisting of a plurality of pairs of semiconductor layers stacked one upon another, one layer in each pair having an index of refraction which is different from the index of refraction of the other layer of the pair, any two adjacent layers forming a heterojunction, one of the two adjacent layers having a first composition and a first bandgap and the other of the two adjacent layers having a second composition and a second bandgap, the second bandgap being greater than the first bandgap, characterized in that a region on both sides of each heterojunction is semiparabolically composition graded beginning with the composition of one layer and ending with the composition of the other layer, and a selected one of these regions of each heterojunction is modulation doped with dopants creating an electric dipole, whereby one of the conduction band, $E_c$ and valence band, $E_v$ is smoothed out and the other becomes flat.

2. The optical device of claim 1, in which the modulated dopant concentration is produced by doping a region on the wide-gap side of the heterojunction and retaining undoped a region on the narrow-gap material side.

3. The optical device of claim 2 in which said dopant is an acceptor, and the $E_c$ band is smoothed out and $E_v$ band becomes flat.

4. The optical device of claim 2 in which said dopant is a donor and the $E_v$ band is smoothed out and the $E_c$ band becomes flat.

5. The optical device of claim 1, in which the layers of the DBR are deposited and the regions adjacent the heterojunction are semiparabolically graded by MBE technique.

6. The optical device of claim 1, in which said device is a surface emitting laser, said DBR mirror is a unipolar, p-type structure, the edge of conduction band, $E_c$, is smoothed out and the edge of valence band, $E_v$, is flat, and the DBR mirror structure has a lower mirror resistance value relative to an ungraded and/or unmodulated structure.

7. The method of reducing resistance to a current flow across a unipolar structure having a plurality of pairs of semiconductor layers stacked one upon another, one layer in each pair having an index of refraction which is different from the index of refraction of the other layer of the pair, any two adjacent layers forming a heterojunction, one of the two adjacent layers having a first composition and a first bandgap and the other of the two adjacent layers having a second composition and a second bandgap, the second bandgap being wider than the first bandgap characterized by reducing the resistance of the structure by grading the composition of a region on each side of each heterojunction semiparabolically beginning with the composition of one layer and ending with the composition of the other layer and modulation doping a selected one of these regions of each heterojunction with dopants creating an electric dipole, whereby one of the conduction band, $E_c$, and valence band, $E_v$ is smoothed out and the other becomes flat.

8. The method of claim 7, in which the modulated dopant concentration is produced by doping a region on the wide-gap side of the heterojunction and retaining undoped a region on the narrow-gap material side.

9. The method of claim 8 in which said dopant is an acceptor, and the $E_c$ band is smoothed out and $E_v$ band becomes flat.

10. The method of claim 8 in which said dopant is a donor and the $E_v$ band is smoothed out and the $E_c$ band becomes flat.

11. The method of claim 7, in which the layers are deposited and the regions adjacent the heterojunction are semiparabolically graded by MBE technique.

12. A method of claim 7, in which said device is a surface emitting laser, said DBR mirror is a unipolar, p-type structure, the edge of conduction band, $E_c$, is smoothed out and the edge of valence band, $E_v$ is flat, and the DBR mirror structure has a lower resistance value relative to an ungraded and/or unmodulated structure.

* * * * *